(12) United States Patent
Toh et al.

(10) Patent No.: US 9,142,487 B2
(45) Date of Patent: Sep. 22, 2015

(54) PACKAGING STRUCTURAL MEMBER

(71) Applicant: United Test and Assembly Center Ltd., Singapore (SG)

(72) Inventors: Chin Hock Toh, Singapore (SG); Yi Sheng Anthony Sun, Singapore (SG); Xue Ren Zhang, Singapore (SG); Ravi Kanth Kolan, Singapore (SG)

(73) Assignee: UNITED TEST AND ASSEMBLY CENTER LTD., Singapore (SG)

( * ) Notice: Subject to any disclaimer, the term of this patent is extended or adjusted under 35 U.S.C. 154(b) by 0 days.

(21) Appl. No.: 13/737,923

(22) Filed: Jan. 9, 2013

(65) Prior Publication Data

US 2013/0119560 A1 May 16, 2013

Related U.S. Application Data

(63) Continuation of application No. 12/505,552, filed on Jul. 20, 2009, now Pat. No. 8,384,203.

(60) Provisional application No. 61/081,745, filed on Jul. 18, 2008.

(51) Int. Cl.
*H01L 23/48* (2006.01)
*H01L 23/52* (2006.01)
(Continued)

(52) U.S. Cl.
CPC .............. *H01L 23/481* (2013.01); *H01L 21/50* (2013.01); *H01L 21/6835* (2013.01); *H01L 23/49816* (2013.01); *H01L 23/49827* (2013.01); *H01L 23/49833* (2013.01); *H01L 23/5389* (2013.01); *H01L 24/24* (2013.01); *H01L 24/82* (2013.01); *H01L 24/97* (2013.01); *H01L 25/0657* (2013.01); *H01L 25/105* (2013.01); *H01L 21/563* (2013.01); *H01L 21/568* (2013.01); *H01L 24/19* (2013.01); *H01L 24/96* (2013.01); *H01L 2221/68345* (2013.01);
(Continued)

(58) Field of Classification Search
CPC ................. H01L 2924/15311; H01L 2224/97; H01L 2224/16225; H01L 2224/32145; H01L 23/5384; H01L 23/5386; H01L 23/538; H01L 23/49827; H01L 25/0657
See application file for complete search history.

(56) References Cited

U.S. PATENT DOCUMENTS 6,159,767 A 12/2000 Eichelberger
6,294,407 B1 * 9/2001 Jacobs .......................... 438/118
(Continued)

FOREIGN PATENT DOCUMENTS

TW 200300283 A 5/2003
TW 200620576 A 6/2006

*Primary Examiner* — Marvin Payen
*Assistant Examiner* — Jeremy Joy
(74) *Attorney, Agent, or Firm* — Horizon IP Pte. Ltd.

(57) ABSTRACT

A structural member for use in semiconductor packaging is disclosed. The structural member includes a plurality of packaging regions to facilitate packaging dies in, for example, a wafer format. A packaging region has a die attach region surrounded by a peripheral region. A die is attached to the die attach region. In one aspect, the die attach region has opening through the surfaces of the structural member for accommodating a die. Through-vias disposed are in the peripheral regions. The structural member reduces warpage that can occur during curing of the mold compound used in encapsulating the dies. In another aspect, the die attach region does not have an opening. In such cases, the structural member serves as an interposer between the die and a substrate.

20 Claims, 14 Drawing Sheets

(51) Int. Cl.
    *H01L 25/065*    (2006.01)
    *H01L 21/683*    (2006.01)
    *H01L 23/498*    (2006.01)
    *H01L 23/538*    (2006.01)
    *H01L 23/00*     (2006.01)
    *H01L 25/10*     (2006.01)
    *H01L 21/50*     (2006.01)
    *H01L 21/56*     (2006.01)

(52) U.S. Cl.
    CPC ............... *H01L 2224/0401* (2013.01); *H01L 2224/04105* (2013.01); *H01L 2224/16225* (2013.01); *H01L 2224/24227* (2013.01); *H01L 2224/2518* (2013.01); *H01L 2224/32225* (2013.01); *H01L 2224/73204* (2013.01); *H01L 2224/97* (2013.01); *H01L 2225/1035* (2013.01); *H01L 2225/1058* (2013.01); *H01L 2924/01029* (2013.01); *H01L 2924/01033* (2013.01); *H01L 2924/01087* (2013.01); *H01L 2924/10253* (2013.01); *H01L 2924/14* (2013.01); *H01L 2924/15311* (2013.01); *H01L 2924/15331* (2013.01); *H01L 2924/3511* (2013.01)

(56) References Cited

U.S. PATENT DOCUMENTS

| | | | |
|---|---|---|---|
| 6,664,617 B2 | 12/2003 | Siu | |
| 6,669,617 B1 | 12/2003 | Sumida et al. | |
| 6,781,242 B1 | 8/2004 | Fan et al. | |
| 6,891,273 B2 * | 5/2005 | Pu et al. | 257/780 |
| 6,991,966 B2 | 1/2006 | Tuominen | |
| 7,619,901 B2 * | 11/2009 | Eichelberger et al. | 361/763 |
| 2001/0054758 A1 | 12/2001 | Isaak | |
| 2002/0020898 A1 | 2/2002 | Vu et al. | |
| 2002/0066948 A1 * | 6/2002 | Kim | 257/678 |
| 2002/0117743 A1 | 8/2002 | Nakatani et al. | |
| 2002/0185303 A1 * | 12/2002 | Takeuchi et al. | 174/256 |
| 2003/0068852 A1 * | 4/2003 | Towle et al. | 438/200 |
| 2003/0103338 A1 * | 6/2003 | Vandentop et al. | 361/767 |
| 2005/0046002 A1 * | 3/2005 | Lee et al. | 257/678 |
| 2005/0124148 A1 * | 6/2005 | Tuominen | 438/618 |
| 2006/0001179 A1 * | 1/2006 | Fukase et al. | 257/778 |
| 2006/0097402 A1 * | 5/2006 | Pu et al. | 257/777 |
| 2006/0131736 A1 | 6/2006 | Jansman et al. | |
| 2006/0234420 A1 * | 10/2006 | Yokozuka et al. | 438/106 |
| 2007/0096291 A1 * | 5/2007 | Kawabata et al. | 257/700 |
| 2007/0126122 A1 * | 6/2007 | Bauer et al. | 257/774 |
| 2008/0111233 A1 | 5/2008 | Pendse | |
| 2008/0157316 A1 | 7/2008 | Yang | |
| 2008/0277800 A1 * | 11/2008 | Hwang et al. | 257/777 |
| 2009/0065907 A1 * | 3/2009 | Haba et al. | 257/621 |
| 2009/0200662 A1 * | 8/2009 | Ng et al. | 257/723 |
| 2009/0294938 A1 * | 12/2009 | Chen | 257/676 |
| 2009/0309212 A1 | 12/2009 | Shim et al. | |

* cited by examiner

PACKAGING STRUCTURAL MEMBER

BACKGROUND

In semiconductor fabrication, a plurality of silicon dies are typically formed in parallel on a common substrate and further processed to encapsulate the dies in mold compound. After processing of the die-substrate assembly is completed, it is diced to separate or singulate the assembly into individual units.

One challenge in providing the encapsulation is that warpage may occur due to a mismatch in the Coefficient of Thermal Expansion (CTE) of the mold compound and the silicon die. This problem becomes aggravated when the encapsulation is carried out on an array of silicon dies mounted onto a common substrate such as in a wafer format, and even more so when the thickness of the silicon dies and the substrate decreases. Furthermore, when mounted onto a common substrate, the silicon dies may shift out of its designated location during molding. Additionally, another challenge faced by this form of assembly is optimising the number of dies that can be mounted onto the common substrate so as to maximise space savings.

Based on the foregoing discussion, the packages and/or package techniques are desirable to address one or more of the above disadvantages.

SUMMARY

A method of assembling devices is disclosed. One embodiment employs the use of a structural member which is mated to a first surface of a temporary carrier substrate with an adhesive. The structural member includes a plurality of die package regions. A die package region has a die attach region surrounded by a peripheral region. Dies are attached to the die attach regions of the structural member. Through-vias are disposed in the package regions of the structural member. The through-vias comprise a conductive material and are electrically coupled to bond pads of the dies.

In another embodiment a semiconductor package is disclosed. The package includes a structural member having first and second major surfaces. The structural member includes a die attach region surrounded by a peripheral region. The die attach region accommodates a die to be packaged. At least one through-via is disposed in the structural member. The through-vias extend through the first and second surfaces of the structural member.

In yet another embodiment, a method of assembling a device is disclosed. One embodiment employs the use of a structural member which is mated to a first surface of a temporary carrier substrate with an adhesive. The structural member includes a die package region. The die package region has a die attach region surrounded by a peripheral region. A die is attached to the die attach region of the structural member. Through-vias are disposed in the package region of the structural member. The through-vias comprise a conductive material and are electrically coupled to bond pads of the die.

A die attach region can, for example, comprise an opening extending through the surfaces of the structural member for accommodating a die therein. The structural member can reduce warpage that can occur during curing of the mold compound used in encapsulating the die.

In other embodiments, the die attach region does not have an opening. In such case, the top surfaces of the die attach and peripheral regions may be coplanar. The die is attached to the structural member in the die attach region. Through-vias are disposed in the die attach region, electrically coupling bond pads of the die. The structural member can serve as an interposer which balances CTE of the components of the package.

Furthermore, other aspects include RDL layers on top and bottom of the package. The RDL layers provide contact pads on top and bottom of the surfaces. The contact pads on the top and bottom surfaces are coupled by the through-vias, which facilitates stacking of the packages.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices or integrated circuits (ICs), which are widely used in applications, such as micro-controllers, wired and wireless data networking, consumer electronics etc. In particular, embodiments relate to a structural member used in packaging the ICs.

Figure 1A:
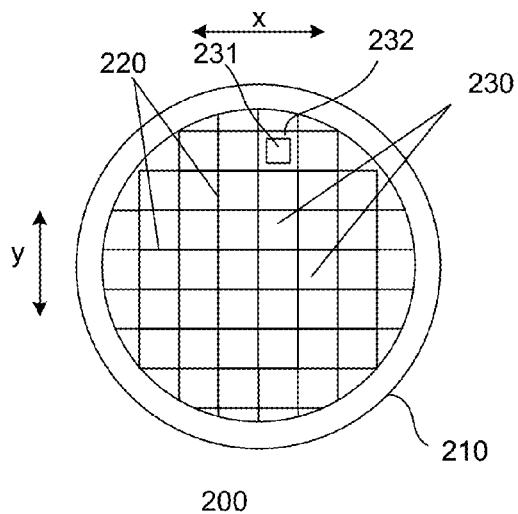
FIGS. 1a-1b show the top and side views of an embodiment of a structural member.
Figure 1B:
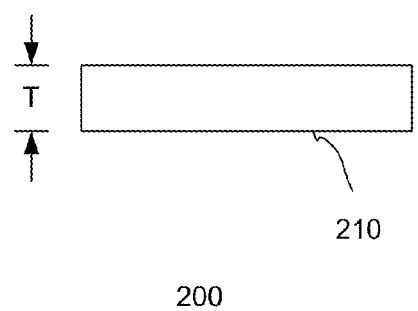
Figure 1C:
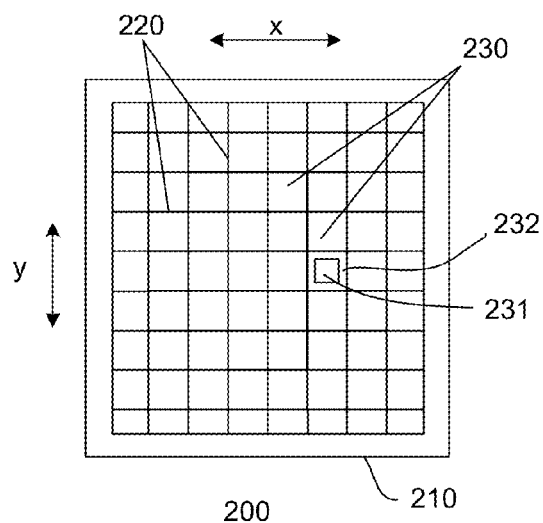
FIGS. 1c-1d show the top and side views of another embodiment of a structural member.
Figure 1D:
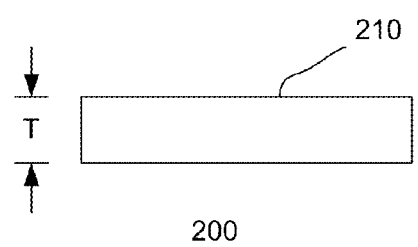

FIGS. 1a and 1b show simplified top and side views of an embodiment of a structural member 200. FIGS. 1c and 1d show top and side views of another embodiment of a structural member 200. Referring to the FIGS. 1a-1d, the structural member 200 facilitates packaging of a plurality of dies in parallel onto a common substrate or carrier. The structural member 200 comprises a frame 210. As shown in FIG. 1a, the frame 210 is of a circular shape, for example, a wafer format. Other geometric shapes may also be useful. For example, as shown in FIG. 1c, the frame 210 may have a square or rectangular shape. Providing a frame in a strip format or other formats is also useful.

Within the frame is a plurality of package regions 230. A package region, in one embodiment, comprises a die attach regions 231 surrounded by a peripheral region 232. A die attach region 231 accommodates a die. The die attach region 231 comprises, for example, an opening (see, for example, element 350 in FIGS. 2a and 2b). The opening, in one embodiment, extends through the top and bottom surfaces of the frame. In one embodiment, the dies which are to be packaged are disposed in the openings. The size and shape of the opening should accommodate the dies. For example, the openings comprise a rectangular shape and have a size sufficient to fit the dies. Providing non-rectangular shaped openings may also be useful. Preferably, the structural member comprises openings which are of the same size and/or same shape for packaging the same type of dies. Alternatively, the structural member may have openings of different sizes and/or shapes for packaging different types of die sizes and/or shapes.

Figure 10A:
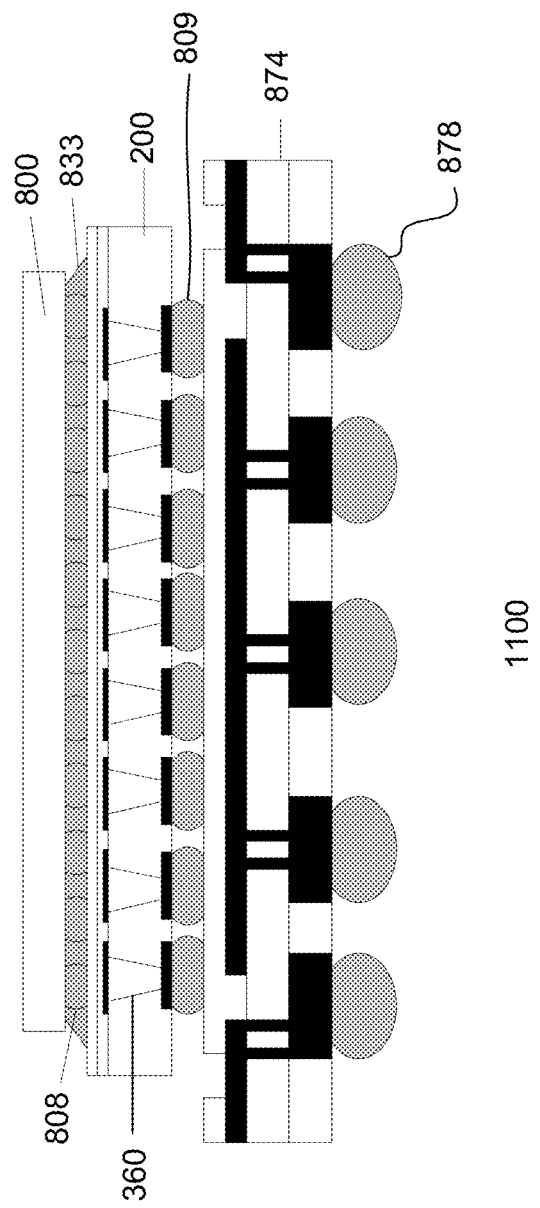
FIGS. 10a-10c show embodiments of stack packages.

In yet other embodiments, the die attach region 231 is devoid of an opening. The structural member, for example, may comprise a planar member. For such applications, the die is attached to the structural member 200 in the die attach region. The structural member, for example, serves as an interposer which is sandwiched between a die and a substrate. An exemplary application of the structural member 200 as an interposer is shown in FIG. 10a.

In a preferred embodiment, the package regions 230 are arranged in rows and columns to form an array. The rows and columns need not have the same number of die attach regions. The number of package regions per row and/or column may depend on, for example, the size of the package regions, size of the frame, shape of the frame or a combination thereof. In the case of a circular frame, for example, the number of package regions of columns and rows toward the edge of the frame may be less than those towards the center of the frame.

The package regions are separated by rails 220 in first and second directions. For example, the openings are separated by rails 220 in the first and second directions. The first and second directions are generally orthogonal to each other. As illustrated, the x and y directions are orthogonal to each other. The rails 220, for example, are integral to the frame 210. In one embodiment, the peripheral regions of the package regions can be disposed in the rails. It is understood that the rails need not be physically distinct from the die attach regions to form a grid. For example, the rails and die attach regions can be integrated to form a planar structural member, such as in the case where the die attach regions are devoid of openings. Alignment lines (not shown) may be provided on the rails. The alignment lines are in the first and second directions. For example, the alignment lines serve as saw lines or saw streets for singulating the packaged dies into individual devices.

Various types of materials may be employed to form the frame 210 and the rails 220. In one embodiment, the frame 210 comprises substrate core materials, including ceramic based materials such as alumina. Other types of materials, such as mold compounds or organic materials, including polyamide, Bismaleimide Triazine (BT) resin or FR-4 or FR-5 materials, may also be useful. The material of the structural member, for example, can be selected to balance CTE of the components of the package.

The frame may be formed using various techniques. For example, the frame may be formed by compression molding, lamination or stencil printing. Other techniques may also be employed to form the frame. The technique, for example, may depend on the type of materials used to form the frame.

The frame comprises a thickness T. In one embodiment, T is equal to or greater than a thickness of the dies to be encapsulated. In another embodiment, T is less than the thickness of the dies to be encapsulated. By providing die attach regions with openings in which dies are disposed, shifting of the dies during encapsulation is reduced or prevented.

Figure 2A:
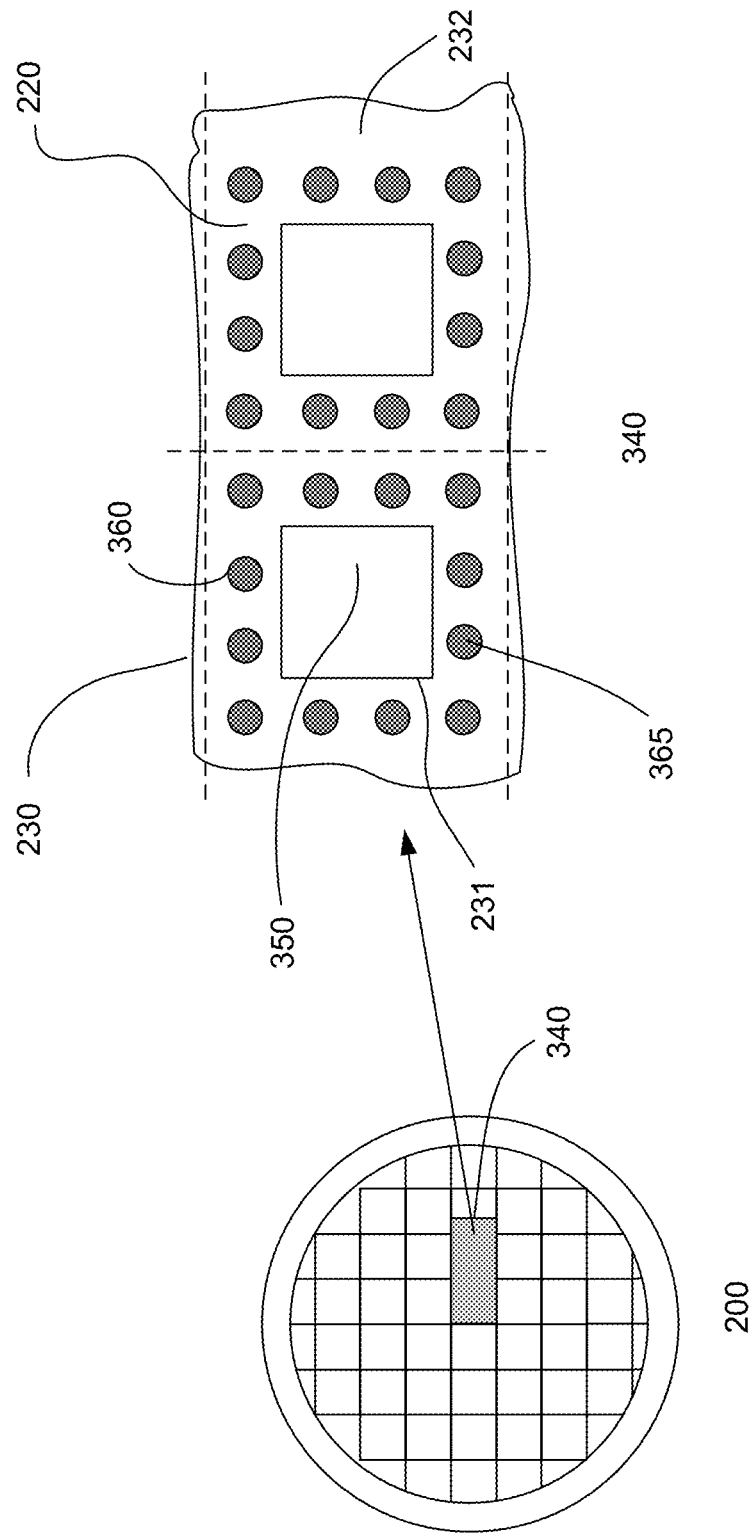
FIGS. 2a-2b show embodiments of enlarged portions of a structural member.
Figure 2B:
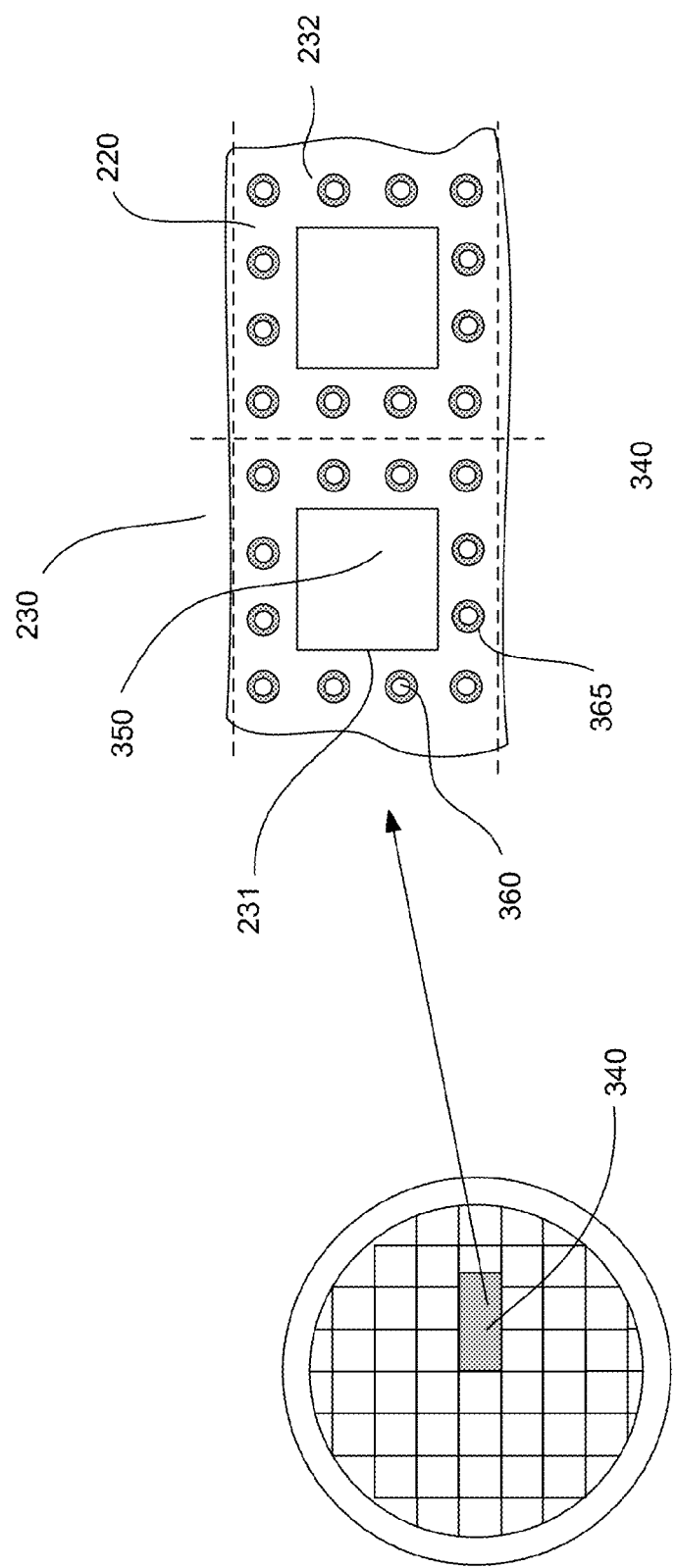

FIGS. 2a-2b show enlarged portions 340 of different embodiments of a structural member 200. The enlarged portions 340 illustrate two adjacent package regions 230 of the structural member 200. A package region 230 comprises a die attach region 231 surrounded by a peripheral region 232. As illustrated, the die attach region 231 comprises an opening 350. The opening, for example, extends through the surfaces of the structural member. The package region 230, in one embodiment, comprises at least one through-via 360. Generally, a plurality of through-vias are disposed in the package region. In one embodiment, the through-vias are disposed in the peripheral region 232 of the package region. The through-vias 360 extend through the top and bottom surfaces of the frame 210. The through-vias 360 can be distributed in any arrangement in the peripheral region 232. For example, the through-vias 360 can be arranged in a line in the peripheral region surrounding the opening, as shown. Other arrangements of through-vias are also useful.

The through-vias 360 can be formed by various techniques. Such techniques can include laser drilling or Deep Reactive Ion Etching (DRIE). Other techniques are also useful. In one embodiment, the vias 360 are filled with a conductive material 365. For example, the vias are filled with copper or copper alloy. Filling the vias with other types of materials is also useful. In one embodiment, the vias are filled by electroplating. The vias can also be filled using other filling techniques. As shown in FIG. 2a, the vias are completely filled with a conductive material 365. Alternatively, as shown in FIG. 2b, the vias are lined with a conductive material 365.

Figure 3A:
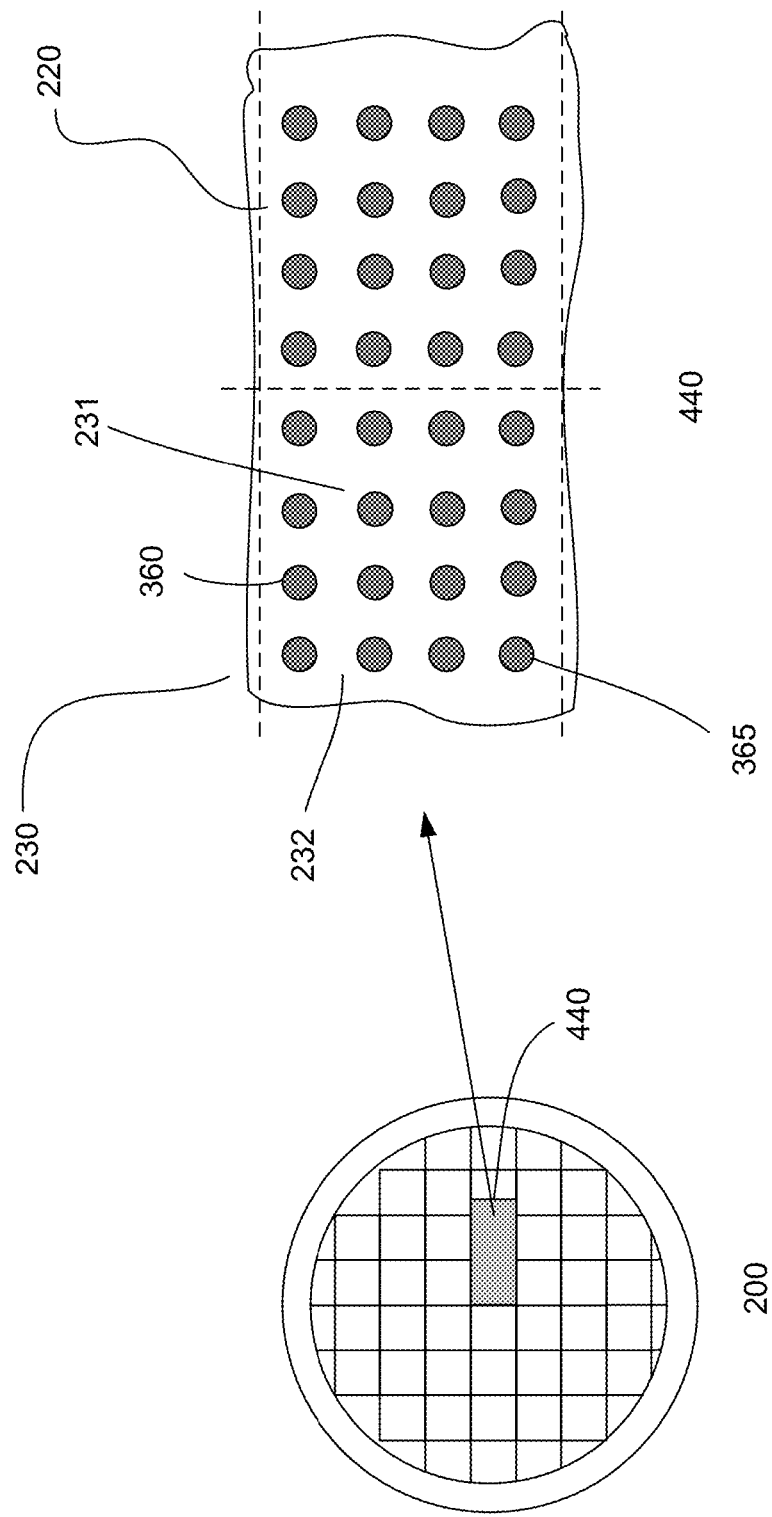
FIGS. 3a-3b show other embodiments of enlarged portions of a structural member.
Figure 3B:
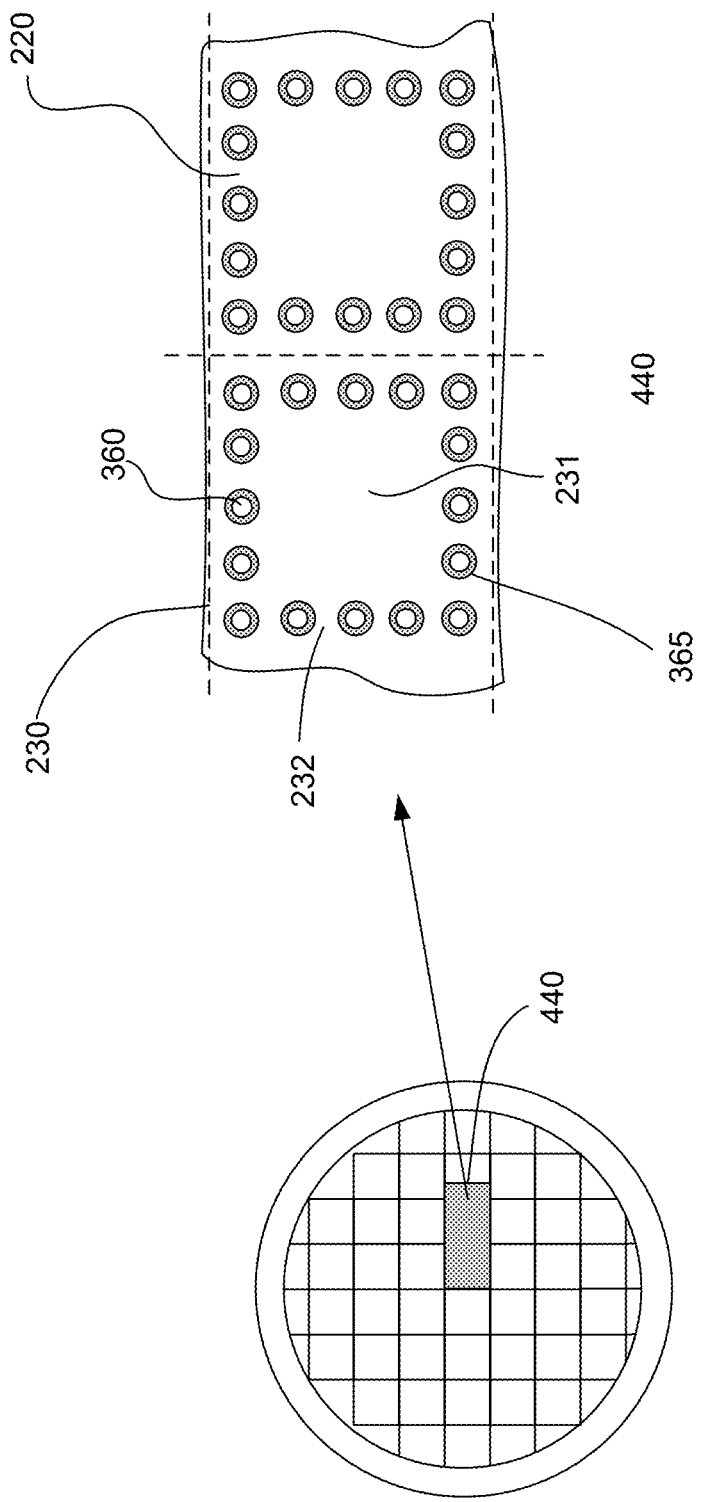

FIGS. 3a-3b show enlarged portions 440 of other embodiments of a structural member 200. The enlarged portions 440 illustrate two adjacent package regions 230 of the structural member 200. A package region, for example, comprises a die attach region 231 surrounded by a peripheral region 232. In one embodiment, the die attach regions comprise no openings. For example, the structural member comprises a planar member.

A package region 230, in one embodiment, comprises at least one through-via 360 therein. Generally, a plurality of through-vias 360 are provided in the package region 230. The through-vias 360 can be distributed in the package region 230 in any configuration. For example, the through-vias 360 can be distributed uniformly throughout the package region (e.g., both die attach region 231 and peripheral region 232), as shown in FIG. 3a or be arranged in the peripheral region 232, as shown in FIG. 3b. Distributing the through-vias 360 in other configurations is also useful.

The through-vias may extend through the top and bottom surfaces of the frame 210. The through-vias 360 may be formed by various techniques. Such techniques may include laser drilling or Deep Reactive Ion Etching (DRIE). Other techniques are also useful.

In one embodiment, the vias 360 are filled with a conductive material 365. For example, the vias 360 are filled with copper or copper alloy. Filling the vias with other types of materials is also useful. In one embodiment, the vias 360 are filled by electroplating. The vias can also be filled using other filling techniques. As shown in FIG. 3a, the vias are completely filled with a conductive material 365. Alternatively, as shown in FIG. 3b, the vias 360 are lined with a conductive material 365.

Figure 4A:
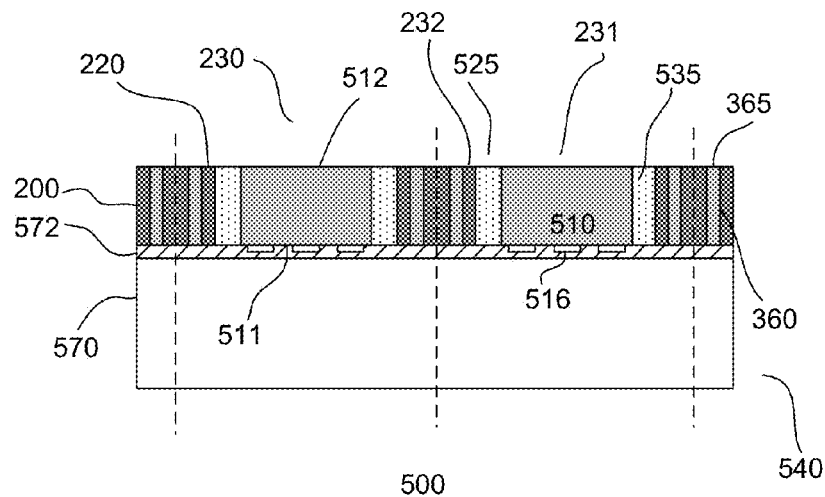
FIGS. 4a-4c show an embodiment of a process employing a structural member.
Figure 4C:
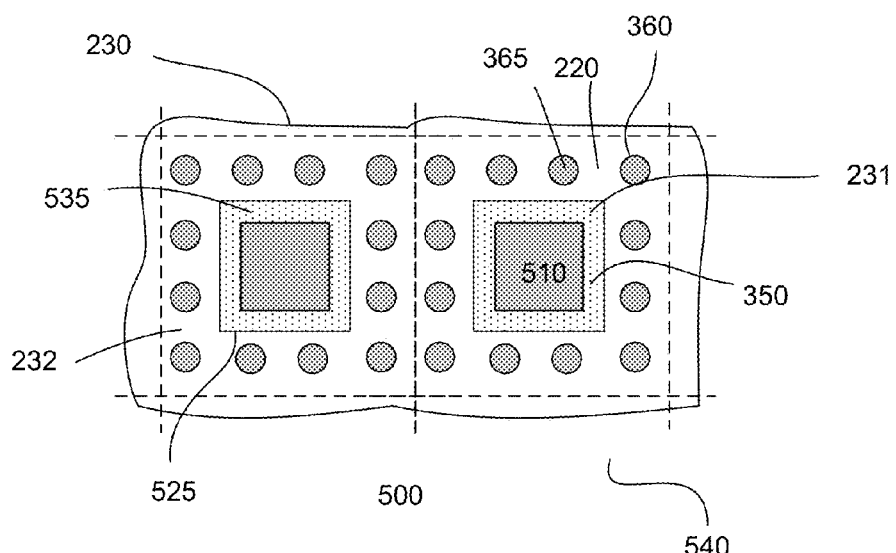
Figure 4B:
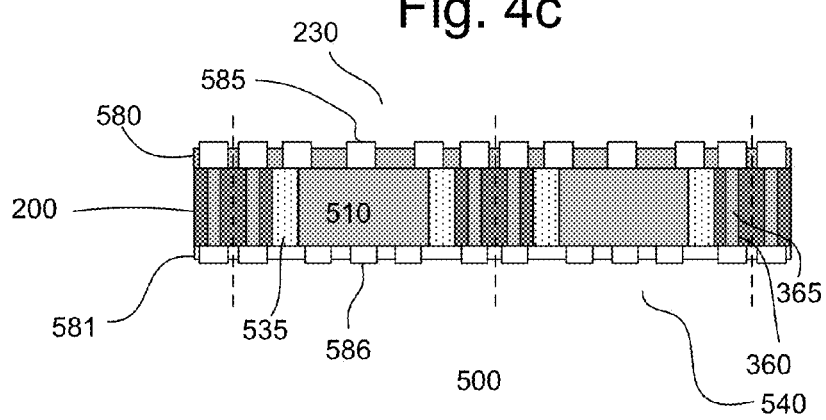

FIGS. 4a-4b illustrate cross-sectional views of an embodiment of a process for assembling a semiconductor package 500. FIG. 4c shows a plan view of the process corresponding to FIG. 4a. For simplification, the Figures show a portion 540 depicting two adjacent package regions 230.

Referring to FIG. 4a and FIG. 4c, a temporary support carrier 570 is provided. The temporary support carrier 570, for example, provides a common carrier to which a plurality of dies 510 are mounted for assembly. The temporary support carrier 570 may be formed from various types of materials. For example, the temporary support carrier 570 comprises copper, glass, silicon, quartz, sapphire or any other material that is sufficiently rigid to withstand further processing steps. Other types of materials which can provide mechanical support to the dies are also useful.

The top surface of the temporary support carrier 570 is coated with an adhesive 572. The adhesive can be any temporary adhesive which can lose its adhesive strength when subjected to a treatment. In one embodiment, the adhesive loses its adhesive strength when heated to a threshold temperature. Mated to the top surface of the temporary support carrier 570 is a structural member 200. In one embodiment, the structural member 200 is temporarily mated to the top surface with the adhesive. Once the adhesive is treated to lose its adhesive strength, the support carrier can be separated or dislodged from the structural member.

The structural member 200 comprises a plurality of package regions 230. A package region includes a die attach region 231. The structural member facilitates assembly of dies in, for example, a wafer format. The structural member may also be configured to facilitate assembling the dies in other formats. In one embodiment, the die attach regions comprise openings 350. Through-vias 360 filled with a conductive material 365, such as copper or copper alloy, are provided. In other embodiments, the sidewalls of the through-vias are coated with conductive material 365. The through-vias, for example, are disposed in the rail portions 220 of the structural member 200 (e.g., peripheral regions 232) peripheral to the opening 350. In one embodiment, the structural member is prefabricated with openings and through-vias filled or lined with a conductive material prior to mating to the substrate. In other embodiments, the through-vias may be formed and filled after being mated to the substrate. The through-vias may be formed before or after encapsulation.

In one embodiment, dies 510 are disposed in the openings 350 of the structural member 200. The dies 510 are temporarily attached to the support carrier 570 by the adhesive 572. As shown, an active surface 511 of the die with die bond pads 516 disposed thereon is mated to the support carrier 570. The thickness T of the structural member, in one embodiment, is the same or substantially the same as the height of the die. This results in top surfaces of the structural member and die being about coplanar.

Since the dies are smaller than the opening, gaps 525 exist between the dies and opening sidewalls. After the dies are mated to the support carrier 570 surface, the dies 510 are encapsulated by filling the gaps with a mold compound 535. In one embodiment, the top surface of the mold compound 535 is flush with the top surfaces of the die 510 and structural member 200. The structural member, for example, acts as a stencil for filling the gaps. The structural member 200 may also reduce shifting of the dies 510 during encapsulation. After encapsulation, the mold compound is cured. Curing, for example, comprises exposing the die assembly to heat.

Referring to FIG. 4c, a top redistribution layer (RDL) 580 is formed on the assembly. For example, the top RDL 580 is formed on the top surface of the frame 210 and inactive surface of the die 510. The top RDL 580, for example, comprises conductive lines. RDL contact pads 585 are formed along the top RDL 580. The conductive lines couple the RDL contact pads 585 to the through-vias 360 at the periphery of the opening 350. The pattern of the RDL contact pads 585 corresponds to, for example, the pattern of contact pads of another package or chip to be stacked on the top RDL. The RDL can be formed by various techniques. For example, the RDL can be formed by electroplating. Other techniques for forming the RDL are also useful.

In one embodiment, the temporary support carrier 570 is detached from the assembly after the top RDL is formed. Detachment can be achieved by, for example, heating the adhesive until it loses its adhesive strength, enabling the support carrier 570 to be dislodged. Removing the support carrier 570 exposes the active surface 511 of the dies 510. In one embodiment, a bottom RDL 581 is formed on the bottom surface of the assembly. The bottom RDL contacts the bottom surface of the structural member 200 and active surface 511 of the die 510. The bottom RDL 581 couples the die bond pads 516 to the through-vias 360, resulting in the die pads being coupled to the top RDL 580 and top RDL contact pads 585. The top and bottom RDLs facilitate stacking of dies or other packages to reduce overall footprint of the device.

A singulation process is performed after assembly is completed to separate the packages into individual packages. In one embodiment, the singulation process comprises sawing the frame along saw lines or saw streets to separate the die attach regions into individual packages.

Advantageously, the structural member 200 provides structural integrity or mechanical support to the array of dies in wafer format or other formats to prevent warpage from occurring during the assembly process and in particular during the encapsulation and curing process. The structural member 200 may also prevent the dies 510 from shifting out of its designated locations during encapsulation. The structural member 200 with the through-vias 360 is incorporated into the final package and can act as a pathway to connect the dies 510, through the bottom RDL 581, the through-vias 360, and the top RDL 580, to the top RDL contact pads 585. This can then facilitate stacking of further packages or dies onto the package.

Figure 5A:
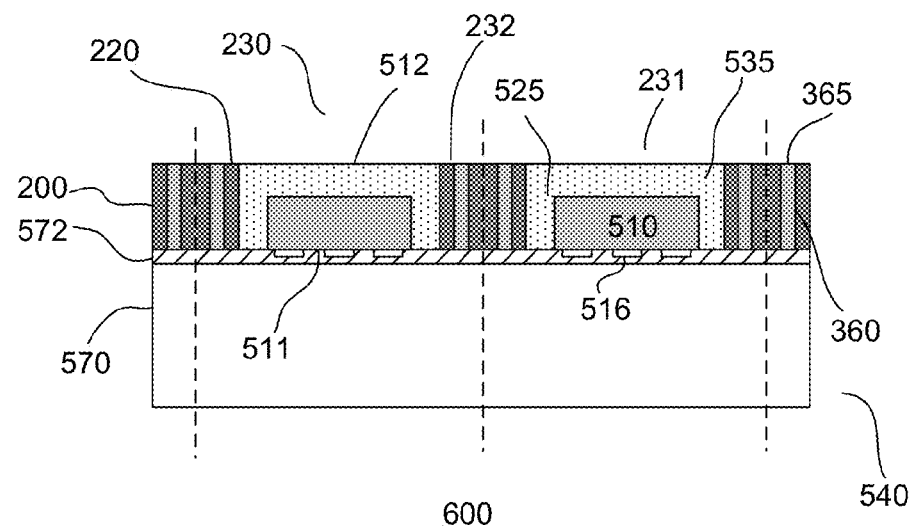
FIGS. 5a-5b to FIGS. 7a-7b show other processes employing a structural member.
Figure 5B:
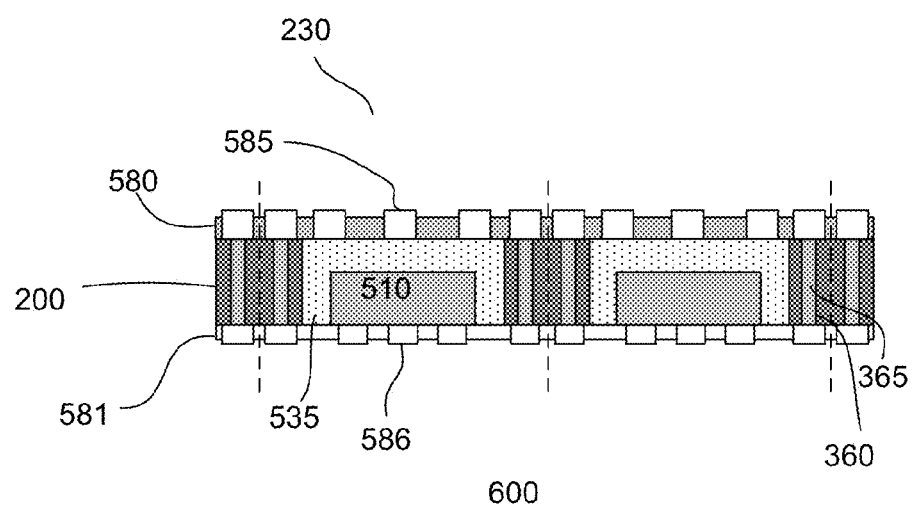

FIGS. 5a-5b show cross-sectional views of another embodiment of a process 600 for assembling a semiconductor package. The process is similar to that described in FIGS. 4a-4b. The difference is that the frame 210 comprises a thickness T which is greater than the height of the dies 510. In one embodiment, the mold compound 535 filling the gaps 525 also covers the inactive surface 512 of the dies 510 such that the top surface of the mold compound 535 is about coplanar with the top surface of the frame 210. After encapsulation, the process continues as described. For example, the process continues by forming a top RDL layer 580, detaching the substrate 570, forming bottom RDL layer 581 and singulating the assembly.

As described, the mold compound is flush with the top surface of the frame. In alternative embodiments, the mold compound may cover both the frame and die. For applications in which the mold compound covers the frame, the through-vias are preferably formed after encapsulation. For example, through-vias are formed through the mold compound and frame.

Figure 6A:
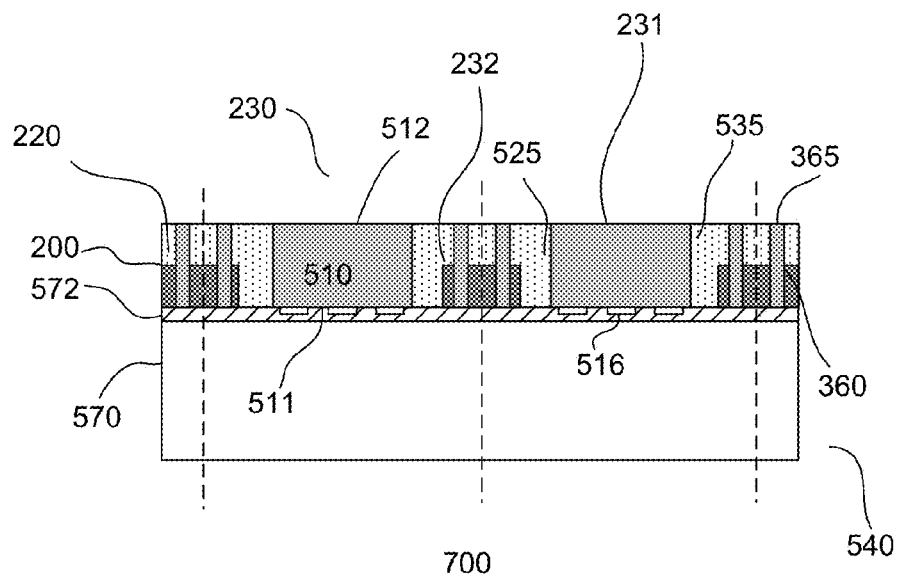
Figure 6B:
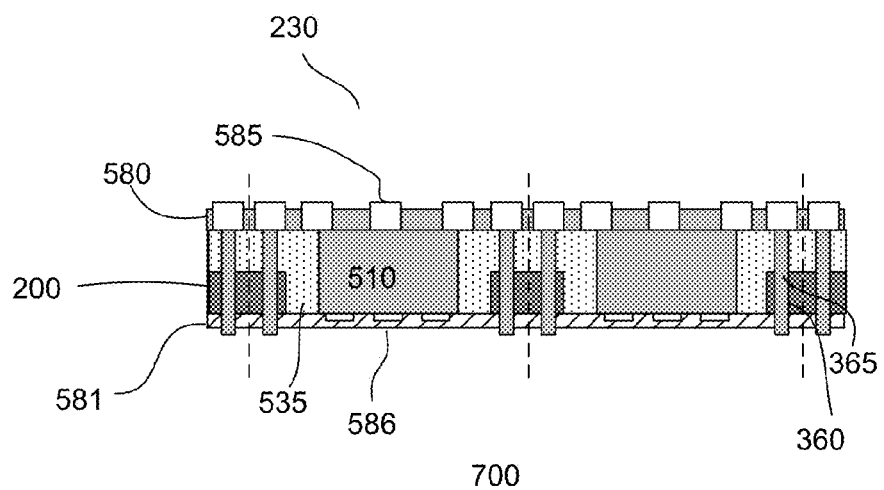
Figure 7A:
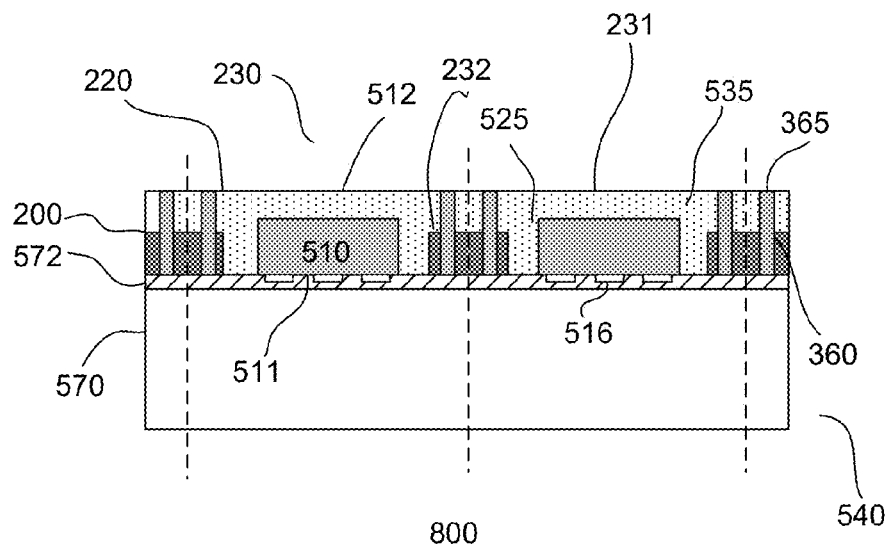
Figure 7B:
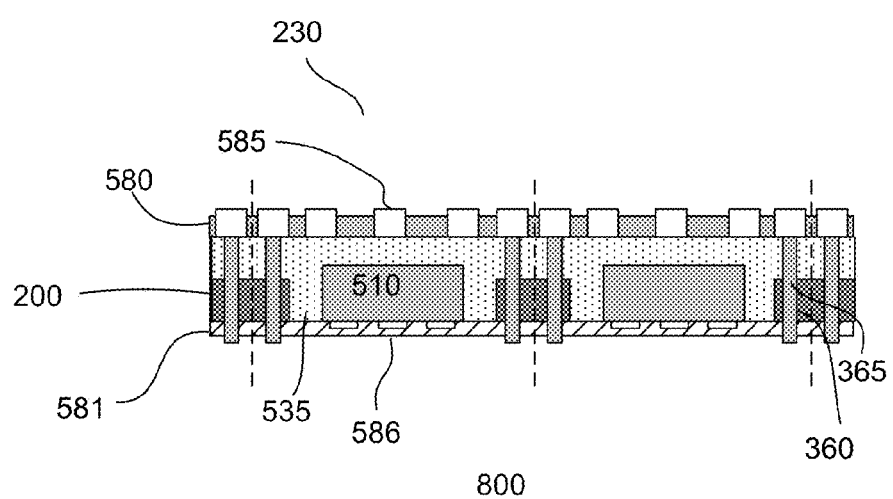

FIGS. 6a-6b and FIGS. 7a-7b show cross-sectional views of other processes 700 and 800 for assembling a semiconductor package. The processes are similar to that described in FIGS. 4a-4b. The difference is that the frame 210 comprises a thickness T which is less than the height of the dies 510. In one embodiment, the mold compound 535 filling the gaps 525 also covers the frame 210 such that the top surface of the mode compound is about coplanar with the inactive or top surface of the dies 510, as shown in FIGS. 6a-6b. Alternatively, the mold compound 535 covers both the frame 210 and the dies 510, as shown in FIGS. 7a-7b.

For applications in which the mold compound covers the frame, the through-vias 360 are preferably formed after encapsulation. For example, through-vias are formed through the mold compound and frame.

After encapsulation, the process continues as described. For example, the process continues by forming a top RDL layer 580, detaching the substrate 570, forming bottom RDL layer 581 and singulating the assembly.

In yet other embodiments, the structural member comprises a plurality of die attach regions 230 without openings. For example, the structural member 200 comprises a flat member. Through-vias 360 may be provided in the die attach region 230 to electrically couple the die 510 to a substrate.

In applications involving die attach regions without openings, the structural member 200 may serve as an interposer between the die and substrate to balance CTE mismatch between the components. The structural member 200 may also be used as a distribution pathway to couple die bonds pads of a certain pitch to substrate contact pads of a different or same pitch.

Figure 8A:
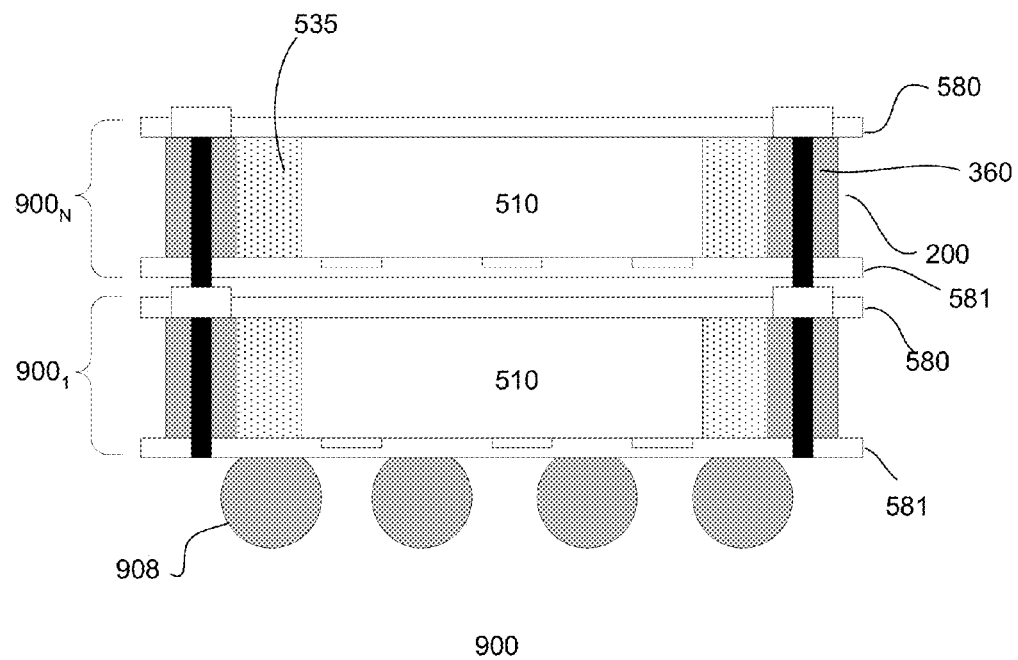
FIGS. 8a-8b show embodiments of stack packages.
Figure 8B:
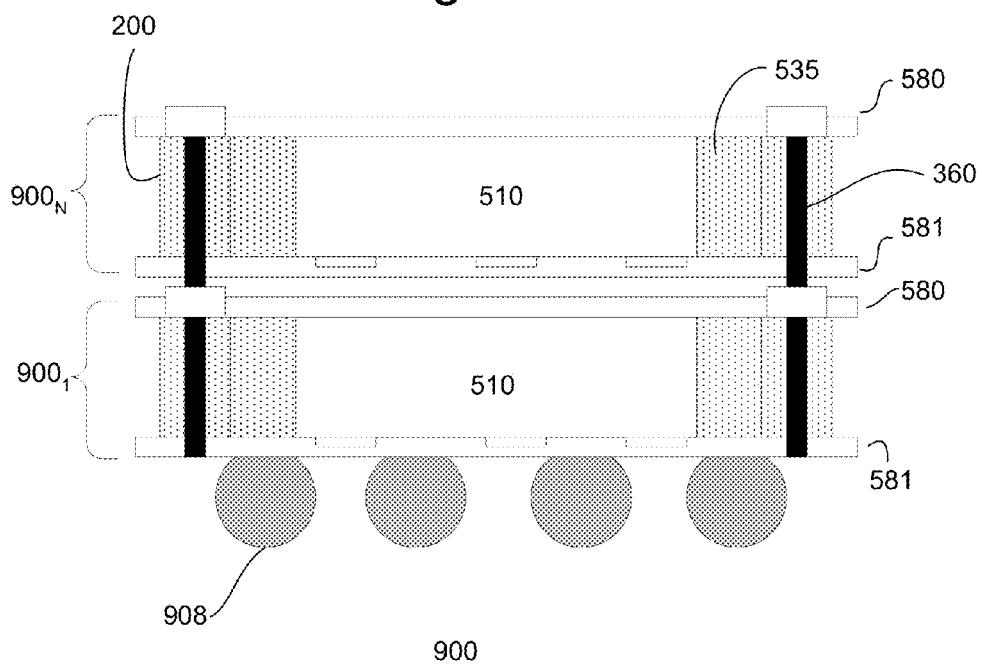

FIGS. 8a-8b show embodiments of stack packages 900. In one embodiment, a stack package comprises a plurality of die packages $900_{1-N}$ configured in a stack. As shown, the stack package comprises a first package $900_1$ with a second package $900_N$ (where N=2) disposed thereabove. The stack package may comprise packages formed by any of the processes described above. For example, the packages includes a structural member 200 with mold compound 535 filling at least gaps in the die attach region with a die 510. The packages may include top and bottom RDL layers 580 and 581 with through-vias 360.

In one embodiment, the packages comprise a structural member having the same height as the die. For example, the fill material has a top surface which is flush or coplanar with the top surfaces of the structural member and die. The structural member and the mold compound, for example, comprise different materials, as shown in FIG. 8a. Alternatively, the structural member and the mold compound comprise the same material, as shown in FIG. 8b. As illustrated, the packages of the stack are of the same type. In other embodiment, the packages of the stack may be different types of packages. For example, the die packages can comprise a combination of packages as described above, such as having structural members with different heights.

Figure 9:
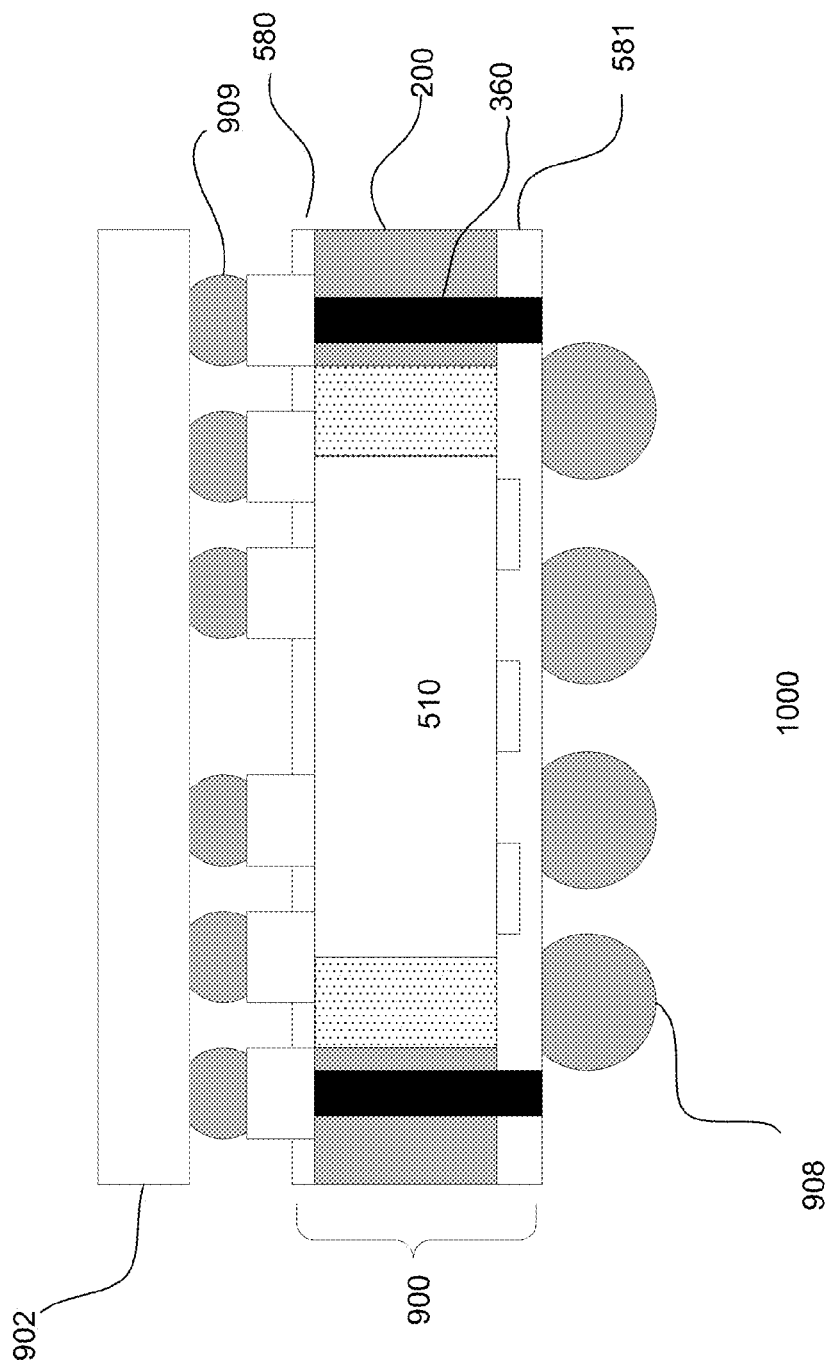
FIG. 9 shows another embodiment of a stack package.

FIG. 9 shows another embodiment of a stack package 1000. As shown, the package comprises a first package 900. The first package can be a package formed by any of the processes described above. Package contacts 908 are provided on the bottom RDL of the first package. The package contacts, for example, are formed on contact pads of the bottom RDL. The package contacts may be configured in a ball grid array. Other package contact configurations may also be useful. Alternatively the first package can be a package stack, as described in FIGS. 8a-8b. For example, the first package can be a package stack comprising N packages. In one embodiment, a device 902 which is disposed over the first package comprises a flip chip package. The flip chip includes chip bumps 909 on its active surface. The chip bumps may be configured in a ball grid array. Other configurations of chip bumps may also be useful. The pattern of the top RDL pads of the first package corresponds to the pattern of the chip bumps of the device.

The chip bumps 909 of the second package are coupled to the top RDL 580 of the first package. Alternatively, instead of a flip chip, the second package can be another package to form a Package-On-Package structure.

Referring to FIGS. 8-9, it can be appreciated that the structural member 200 provides an access route coupling the die in the first package to a second package or die stacked above. In FIG. 8, the die in the first package $900_1$ communicates with the die in the second package $900_N$ through the bottom RDL 581 of the first package, the through-vias 360 of the first package, the top RDL 580 of the first package and the bottom RDL 581 of the second package which is coupled to the die in the second package. Likewise in FIG. 10, the structural member 200 provides a similar mode of access from the die in the first package to the device or flip chip stacked thereon.

Figure 10B:
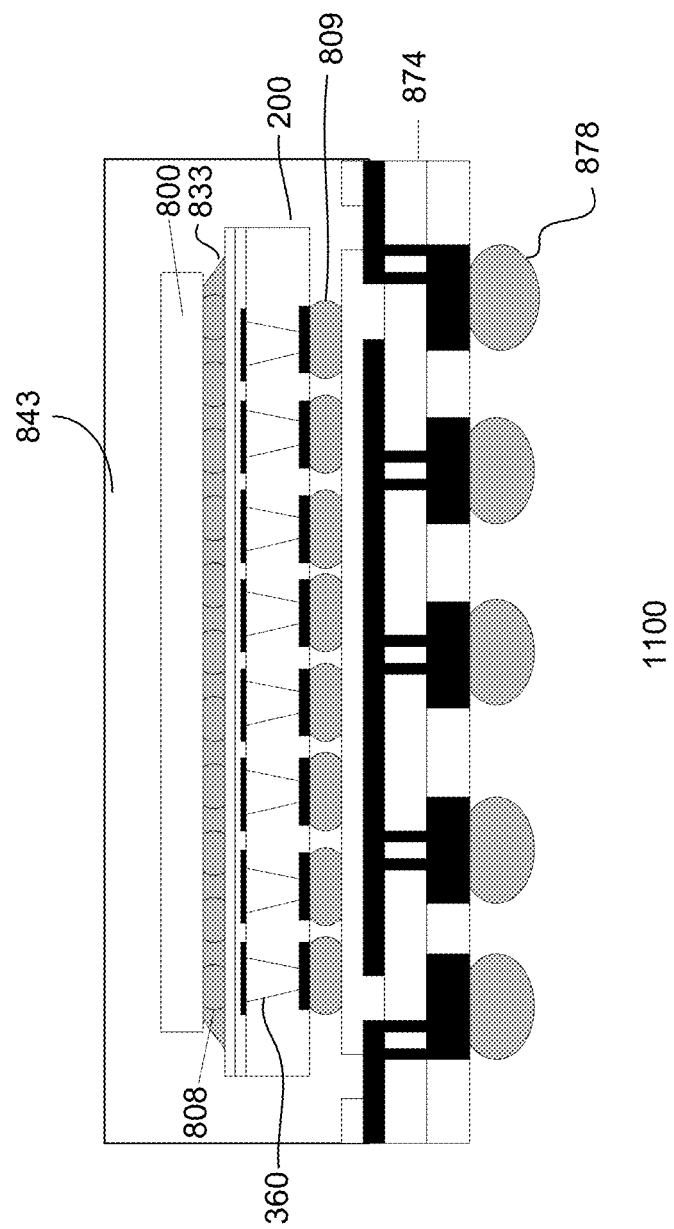
Figure 10C:
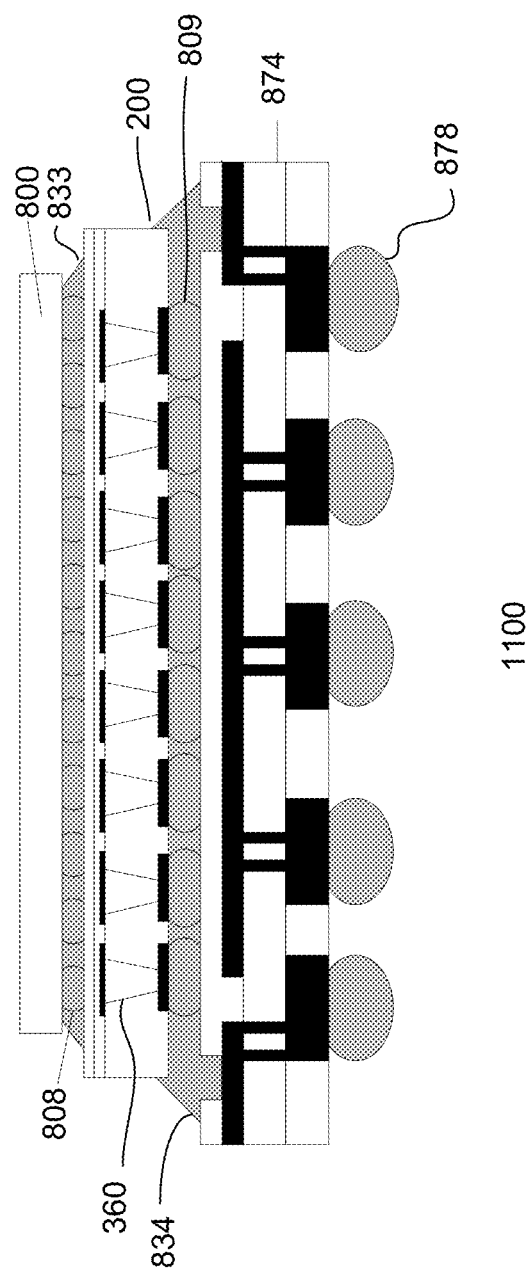

FIGS. 10a-10c illustrate other embodiments of a semiconductor package 1100. Referring to FIG. 10a, the package comprises a substrate 874. The substrate 874 can for example be a Bismaleimide Triazine (BT) substrate. The substrate 874 includes top and bottom surfaces. The bottom surface is provided with package contacts 878. The package contacts, for example, are configured in a ball grid array. Other configurations of the package contacts may also be useful. The top surface, for example, includes substrate pads which are coupled to the package contacts by, for example, internal conductive traces.

A chip package 800 is mounted on the substrate 874. The chip package, in one embodiment, comprises a flip chip with chip bumps 808 on its active surface. The chip bumps are electrically coupled to the package contacts. In other embodiment, the chip package may comprise any of the packages as described in FIGS. 4a-4b to 7a-7b.

In accordance with one embodiment, a structural member 200 is disposed between the chip package 800 and substrate 874. The structural member 200 comprises top and bottom RDLs. The top RDL comprises top RDL contact pads. The pattern of the top RDL contact pads corresponds to, for example, the chip bumps of the chip package. The bottom RDL comprises bottom RDL contact bumps 809. The pattern of the bottom RDL contact bumps, for example, corresponds to the substrate pads. The top and bottom RDL contact pads are coupled by the through-vias 360.

The chip package is mounted onto the top surface of the structural member. An underfill 833 may be provided between the chip bumps and top RDL. The bottom of the structural member is coupled to the top surface of the substrate. By disposing the structural member between the substrate and chip package, it acts as an interposer. The interposer provides electrical connection between the substrate and the chip package. In one embodiment, the structural member and chip package can be assembled in parallel, as previously described.

In one embodiment, the material of the structural member is appropriately selected to balance the CTE mismatch between the chip package, the filled through-vias and the substrate. The materials of the structural member can be selected from, for example, substrate core materials, mold compounds, organic materials or mixtures thereof. Other types of materials may also be useful.

The semiconductor package 1100, for example can be encapsulated by a mold compound 843, as shown in FIG. 10b. In other embodiments, the semiconductor package 1100 may be provided with underfill 834 between the interposer and substrate, as shown in FIG. 10c.

As described, one embodiment of the structural member may be made from mold compound material. One advantage of using mold compound as the structural member material is the flexibility in designing the properties of the mold compound. When designed and selected with the appropriate CTE and mechanical properties, the mold compound structural member improves thermal cycle reliability.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor package comprising:
a package substrate having top and bottom surfaces, wherein the bottom surface comprises a plurality of package contacts;
a structural member having first and second major planar surfaces disposed directly on top of the top surface of the package substrate, wherein the whole structural member is formed by a single insulator layer and the structural member includes
a die attach region which accommodates a die for packaging and is devoid of an opening,
a peripheral region surrounding the die attach region, wherein the single insulator layer of the structural member extends throughout the die attach region and the peripheral region,
through-vias disposed in both the die attach region and peripheral region and extend from the first to the second major planar surfaces of the structural member, wherein the through-vias comprise conductive material having top and bottom surfaces which are coplanar with the first and second major planar surfaces of the structural member,
top and bottom RDLs having RDL contact pads disposed over the top and bottom surface of the through-vias respectively, wherein the top RDL contact pads are coupled to the bottom RDL contact pads by the through-vias and wherein the top and bottom RDL contact pads and through-vias are separate and distinct connected features, and
a plurality of contact bumps disposed over the second major planar surface; and
a die being disposed directly on top of the structural member and is attached to the first major planar surface of the structural member in the die attach region,
wherein the structural member serves as an interposer between the die and the package substrate.

2. The semiconductor package of claim 1 wherein the die is a flip chip having a plurality of chip bumps being attached to the first major planar surface of the structural member.

3. The semiconductor package of claim 1 wherein the contact bumps are coupled to the bottom RDL contact pads.

4. The semiconductor package of claim 3 comprises an underfill disposed between the structural member and the package substrate.

5. The semiconductor package of claim 3 comprises an encapsulant which encapsulates the die and structural member, wherein the encapsulant covers and contacts the second major planar surface, a portion of the first major planar surface and lateral side surfaces of the structural member and directly contacts the die.

6. The semiconductor package of claim 5 wherein the encapsulant and the single insulator layer of the structural member comprise a first material and the package substrate comprises a second material, wherein the first and second materials are different.

7. The semiconductor package of claim 1 wherein the through-vias comprise tapered sidewalls.

8. A semiconductor package comprising:
a substrate;
a structural member having first and second major surfaces that are substantially planar, the whole structural member is formed by a single insulator layer which is made of mold compounds and the structural member includes
a die attach region which accommodates a die for packaging and is devoid of an opening,
a peripheral region surrounding the die attach region, wherein the single insulator layer of the structural member extends throughout the die attach region and the peripheral region,
a plurality of through-vias, wherein the through-vias extend from the first to the second major surface of the structural member, wherein the through-vias comprise conductive material having top and bottom surfaces which are coplanar with the first and second major surfaces of the structural member,
top and bottom RDLs having RDL contact pads disposed over the top and bottom surface of the through-vias respectively, wherein the top RDL contact pads are coupled to the bottom RDL contact pads by the through-vias and wherein the top and bottom RDL contact pads and through-vias are separate and distinct connected features, and
a plurality of contact bumps disposed on the second major surface;
a die, which comprises a plurality of chip bumps, being attached to the first major surface of the structural member in the die attach region; and
an encapsulant, wherein the encapsulant covers the second major planar-surface and at least a portion of lateral side surfaces of the structural member,
wherein the structural member serves as an interposer between the die and the substrate.

9. The semiconductor package of claim 8 wherein:
the chip bumps comprise a first distance which is the minimum separation between centers of any two adjacent chip bumps,
the contact bumps comprise a second distance which is the minimum separation between centers of any two adjacent contact bumps, and
the first distance is less than the second distance.

10. The semiconductor package of claim 8 wherein the single insulator layer of the structural member which comprises mold compounds balances the CTE mismatch between components of the semiconductor package.

11. The semiconductor package of claim 1 wherein the single insulator layer of the structural member comprises a material which comprises substrate core materials, mold compounds or organic materials.

12. The semiconductor package of claim 8 wherein the encapsulant is an underfill material that fully encapsulates the contact bumps and fills up a space between the structural member and the substrate and only covers a portion of lateral side surfaces of the structural member.

13. The semiconductor package of claim 10 wherein the encapsulant is a mold compound that encapsulates the contact bumps, the structural member and the die.

14. The semiconductor package of claim 13 wherein the encapsulant and the single insulator layer of the structural member comprise the same material.

15. The semiconductor package of claim 8 wherein the plurality of through-vias are disposed in both the die attach region and the peripheral region.

16. The semiconductor package of claim 8 wherein the plurality of through-vias are disposed only in the die attach region.

17. The semiconductor package of claim 8 wherein the plurality of through-vias are disposed only in the peripheral region.

18. The semiconductor package of claim 11 wherein the material comprises an inorganic material, wherein the inorganic material comprises a ceramic based material.

19. The semiconductor package of claim 1 comprising an encapsulant which covers only the second major planar surface and a portion of lateral side surfaces of the structural member.

20. The semiconductor package of claim 12 further comprising a separate underfill material that covers the chip bumps and top RDL.

* * * * *